United States Patent
Lee (10) Patent No.: US 6,900,747 B2
(45) Date of Patent: May 31, 2005

(54) METHOD OF COMPRESSING LOOKUP TABLE FOR REDUCING MEMORY, NON-LINEAR FUNCTION GENERATING APPARATUS HAVING LOOKUP TABLE COMPRESSED USING THE METHOD, AND NON-LINEAR FUNCTION GENERATING METHOD

(75) Inventor: Heon-soo Lee, Yongin (KR)

(73) Assignee: Samsung Electronics, Co., Ltd. (KR)

( * ) Notice: Subject to any disclaimer, the term of this patent is extended or adjusted under 35 U.S.C. 154(b) by 30 days.

(21) Appl. No.: 10/685,740

(22) Filed: Oct. 15, 2003

(65) Prior Publication Data

US 2004/0107091 A1 Jun. 3, 2004

(30) Foreign Application Priority Data

Nov. 11, 2002 (KR) ................................ 10-2002-0069658

(51) Int. Cl.[7] ............................ H03M 7/00; G06F 7/38
(52) U.S. Cl. ........................................ 341/106; 708/235
(58) Field of Search ............................. 341/67, 75, 87, 341/106, 65; 382/244, 246, 239; 345/601; 348/674; 704/503; 708/203, 235

(56) References Cited

U.S. PATENT DOCUMENTS

| | | | |
|---|---|---|---|
| 5,047,768 A | * | 9/1991 | Yamaguchi et al. .......... 341/75 |
| 5,703,581 A | * | 12/1997 | Matias et al. ................. 341/67 |
| 6,166,781 A | | 12/2000 | Kwak et al. |
| 6,269,193 B1 | * | 7/2001 | Young et al. ............... 382/244 |
| 6,304,676 B1 | * | 10/2001 | Mathews .................... 382/246 |
| 6,642,931 B1 | * | 11/2003 | Haikin et al. ............... 345/601 |

FOREIGN PATENT DOCUMENTS

KR      10-0219543       6/1999

* cited by examiner

Primary Examiner—Patrick Wamsley
(74) Attorney, Agent, or Firm—Mills & Onello LLP

(57) ABSTRACT

In a method of compressing a lookup table for reducing memory, a non-linear function generating apparatus having a lookup table compressed using the method, and a non-linear function generating method, X-coordinates of the non-linear function are separated into a plurality of sections including steps that have predetermined step sizes. Y-coordinate values corresponding to X-coordinate values are extracted for each step. The Y-coordinate values are stored in predetermined addresses in a memory, wherein the step sizes are different according to the sections. In this manner, memory capacity occupied by the lookup table is reduced.

20 Claims, 9 Drawing Sheets

| SECTION(i) | | STEP (j) | X-COORDINATE VALUE | | Y-COORDINATE VALUE | ADDRESS |
|---|---|---|---|---|---|---|
| SECTION ORDER (iO) | SECTION NUMBER (iN) | | BINARY NUMBER | DECIMAL NUMBER | | |
| i0 | 0 | 0 | 0000000 | 0 | 0.00000 | 0 |
| | | 1 | 0000001 | 1 | 0.00001 | 1 |
| | | 2 | 0000010 | 2 | 0.00002 | 2 |
| | | 3 | 0000011 | 3 | 0.00003 | 3 |
| i1 | 0 | 0 | 0000100 | 4 | 0.00004 | 4 |
| | | 1 | 0000101 | 5 | 0.00005 | 5 |
| | | 2 | 0000110 | 6 | 0.00007 | 6 |
| | | 3 | 0000111 | 7 | 0.00008 | 7 |
| i2 | 1 | 0 | 0001000 | 8 | 0.00010 | 8 |
| | | 1 | 0001010 | 10 | 0.00013 | 9 |
| | | 2 | 0001100 | 12 | 0.00017 | 10 |
| | | 3 | 0001110 | 14 | 0.00020 | 11 |
| i3 | 2 | 0 | 0010000 | 16 | 0.00024 | 12 |
| | | 1 | 0010100 | 20 | 0.00033 | 13 |
| | | 2 | 0011000 | 24 | 0.00042 | 14 |
| | | 3 | 0011100 | 28 | 0.00052 | 15 |
| i4 | 3 | 0 | 0100000 | 32 | 0.00062 | 16 |
| | | 1 | 0101000 | 40 | 0.00083 | 17 |
| | | 2 | 0110000 | 48 | 0.00106 | 18 |
| | | 3 | 0111000 | 56 | 0.00130 | 19 |

METHOD OF COMPRESSING LOOKUP TABLE FOR REDUCING MEMORY, NON-LINEAR FUNCTION GENERATING APPARATUS HAVING LOOKUP TABLE COMPRESSED USING THE METHOD, AND NON-LINEAR FUNCTION GENERATING METHOD

BACKGROUND OF THE INVENTION

This application claims the priority of Korean Patent Application No. 2002-69658, filed on Nov. 11, 2002 in the Korean Intellectual Property Office, which is incorporated herein in its entirety by reference.

1. Field of the Invention

The present invention relates to a method of compressing a lookup table of a non-linear function generating apparatus used in digital signal processing, a non-linear function generating apparatus, and a non-linear function generating method, and more particularly, to an improved method of compressing a lookup table for reducing memory, a non-linear function generating apparatus having a lookup table compressed using the method, and a non-linear function generating method.

2. Description of the Related Art

In general, semiconductor devices for processing digital signals use non-linear functions. In order to realize the non-linear functions in the semiconductor devices for processing digital signals, numerical formulae or lookup tables are used. Since the process of realizing the non-linear functions using the numerical formulae require a large number of calculation, lookup tables that require a relatively smaller number of calculations are commonly used. However, the lookup tables, on the other hand, require a large amount of memory, so methods for obtaining a precise approximate value while using a small-sized lookup table have been provided. An example of a non-linear function generating apparatus for reducing the size of a lookup table is disclosed in Korean Patent No. 219543 of "Non-linear Function Generating Apparatus Using Lookup Table with Reduced Size".

The non-linear function generating apparatus disclosed in U.S. Pat. No. 6,166,781 is applied to gamma correction of image signals in CRTs. The non-linear function generating apparatus using a lookup table with reduced size disclosed in U.S. Pat. No. 6,166,781 is shown in FIG. 1.

Figure 1:
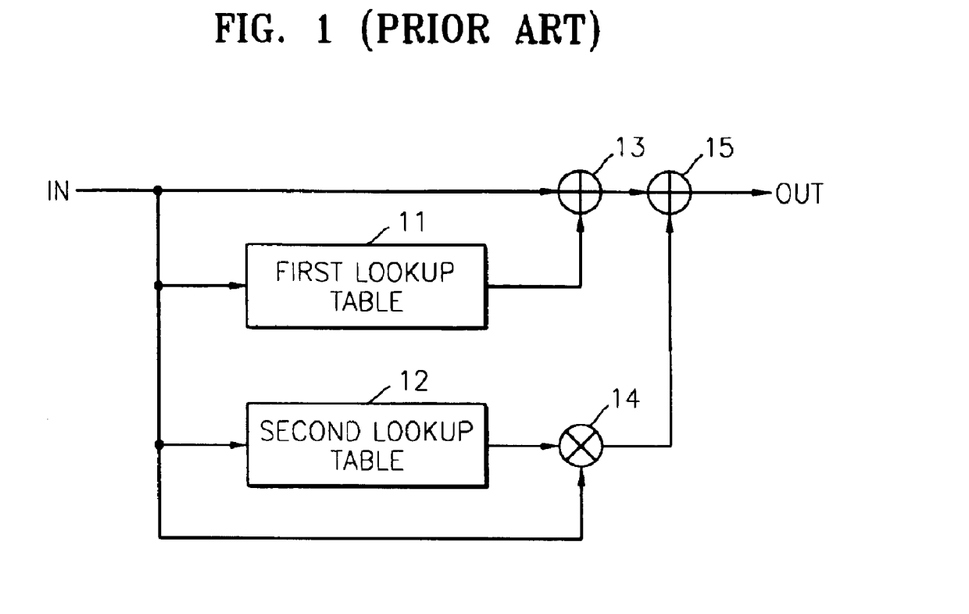
FIG. 1 is a block diagram illustrating a conventional non-linear function generating apparatus.

FIG. 1 is a block diagram illustrating a conventional non-linear function generating apparatus.

Referring to FIG. 1, the conventional non-linear function generating apparatus includes a first lookup table 11, a second lookup table 12, a first adder 13, a multiplier 14, and a second adder 15.

The first lookup table 11 stores the difference between a reference input and a corresponding output, and the second lookup table 12 stores a gradient of other reference inputs adjacent to the reference input and the corresponding outputs.

The first and second adders 13 and 15 and the multiplier 14 calculate the reference input and the output signals from the first and second lookup tables 11 and 12 to output an approximate value corresponding to the reference input.

As described above, the first and second lookup tables 11 and 12 of the conventional non-linear function generating apparatus store the reference values and the gradient values that are extracted by separating the non-linear function in equal intervals. Accordingly, the capacity of the memory occupied by the lookup tables can be reduced.

Such a non-linear function is applied to a decoding process in an MP3 decoder. Hereafter, the decoding process in an MP3 decoder will be described.

A frame header is detected from bit streams of an MP3 file. Thereafter, side information as encoding information of frames, a scale factor, and a Huffman coding data are successively separated. Next, a Huffman decoding operation is performed based on the side information, and the result of the Huffman decoding operation is restored to a real sample energy value in a frequency band according to a requantize spectrum process.

Thereafter, a reordering process, a stereo decoding process, an alias reduction process, and an IMDCT and overlap adding up process are performed to output PCM data, and the PCM data are converted to analog signals by a digital/analog (D/A) converter to be output.

Here, the non-linear function is used in a requantize spectrum process. The requantize spectrum process restores the Huffman decoded result into the real sample value in the frequency band. Here, a non-linear function of $Y=X^{4/3}$, where, X=0, 1/8192, 2/8192, 3/8192, . . . , 8192/8192, is used. In the conventional method of compressing, the lookup table extracts the values of the function $Y=X^{4/3}$ in equal intervals that will be described with reference to the graph of FIG. 2.

Figure 2:
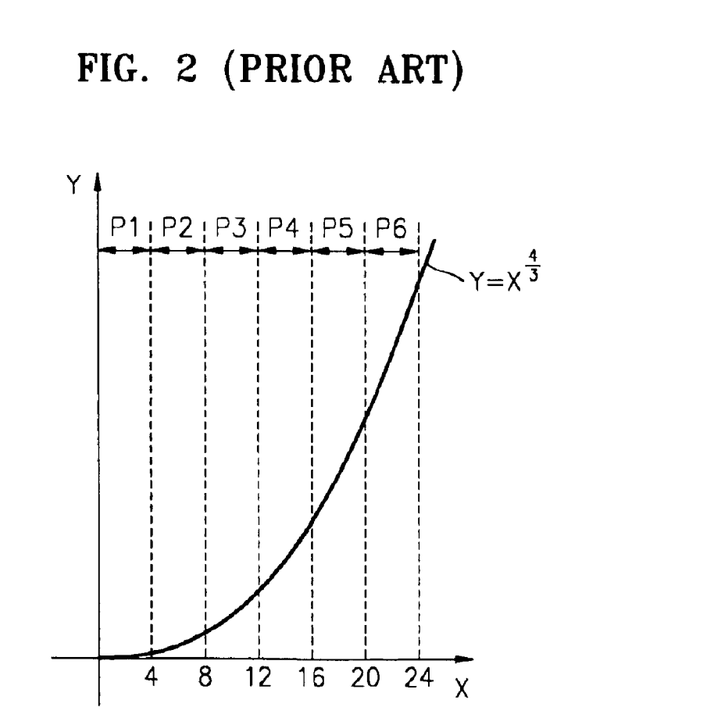
FIG. 2 is a graph for explaining a conventional method of compressing a lookup table of the non-linear function generating apparatus.

FIG. 2 is a graph for explaining the conventional method of compressing the lookup table of the non-linear function generating apparatus.

Referring to FIG. 2, X-coordinate of the function $Y=X^{4/3}$ is separated into a plurality of sections P1 through P6 in equal intervals. In addition, the lookup table stores reference values for each of the sections P1 through P6 and gradient values of the sections P1 through P6 for calculating the values between the reference values that are separated in equal intervals.

Referring to the graph of FIG. 2, the gradient of the function $Y=X^{4/3}$ is steep at the initial state so that the graph forms a curve. As the X-coordinate values increase, the change in the gradient of the function $Y=X^{4/3}$ is reduced regularly.

However, in the conventional method of compressing the lookup table of the non-linear function generating apparatus, the function values are extracted in equal intervals. Accordingly, the lookup table cannot satisfy the values existing in the curve portion, so errors occur.

The conventional method of compressing the lookup table generates a large number of errors in the sections P1 through P3 where the gradient is steep and stores an excessively large number of data in the sections P4 through P6 where the change in the gradient is regularly reduced.

SUMMARY OF THE INVENTION

The present invention provides a method of compressing a lookup table for reducing memory, a non-linear function generating apparatus having a lookup table compressed using the method, and a non-linear function generating method by increasing the intervals between sections and extracting function values in a portion where the changes in the gradient of a non-linear function are reduced when dividing the non-linear function into a plurality of sections. In this manner, the present invention provides an improved method of compressing a lookup table for simple variation sections of a polynomial expression over a quadratic expression and functions in which changes in gradients are regularly reduced, such as an exponential function like y=e^-x, a log function, and a gamma correction scale function.

According to an aspect of the present invention, there is provided a method of compressing a lookup table of an apparatus having a lookup table for reducing memory. The method of an apparatus for generating a non-linear function, for example one in which change in gradient is progressively reduced, comprising separating X-coordinates of the non-linear function into a plurality of sections including steps that have predetermined step sizes; extracting Y-coordinate values corresponding to X-coordinate values for each step; and storing the Y-coordinate values in predetermined addresses in a memory, wherein the step sizes are different according to the sections.

It is preferable that a plurality of sections include the steps having different step sizes.

According to another aspect of the present invention, there is provided an apparatus for generating a non-linear function, for example, one in which in which change in gradient is progressively reduced, comprising an analyzer, a memory, and a calculator.

Here, the analyzer calculates and outputs analysis information including addresses using an input X-coordinate value. The memory includes a lookup table in which Y-coordinate values correspond to the X-coordinate values for each step of the non-linear function, which are separated into a plurality of sections including the steps having predetermined step sizes are stored in predetermined addresses, and the Y-coordinate values corresponding to the addresses are output. The calculator calculates and outputs an approximate Y-coordinate value corresponding to the input X-coordinate value using analysis information and the Y-coordinate values corresponding to the addresses. Here, the step sizes are different according to the sections.

According to still another aspect of the present invention, there is provided a non-linear function generating method of an apparatus for generating a non-linear function having a lookup table for reducing memory. The method of an apparatus having a lookup table in which Y-coordinate values corresponding to X-coordinate values of each step of the non-linear function separated into a plurality of sections including steps with predetermined step sizes are stored in predetermined addresses comprising calculating section information and step information using an input X-coordinate value; calculating an address using the section information and the step information; obtaining a Y-coordinate value corresponding to the address using the lookup table; calculating an approximate X-coordinate value of the input X-coordinate value using the address; calculating step size of the corresponding section using the section information; and calculating and outputting an approximate Y-coordinate value of the Y-coordinate value corresponding to the input X-coordinate value using the approximate X-coordinate-value of the X-coordinate, the Y-coordinate value corresponding to the address, and the step size.

BRIEF DESCRIPTION OF THE DRAWINGS

The above aspects and advantages of the present invention will become more apparent by describing in detail a preferred embodiment thereof with reference to the attached drawings in which.

DETAILED DESCRIPTION OF PREFERRED EMBODIMENTS

The present invention will now be described more fully with reference to the accompanying drawings, in which a preferred embodiment of the invention is shown.

An improved method of compressing a lookup table for reducing memory, according to one embodiment of the present invention, will now be described with reference to FIGS. 3 through 5.

Figure 3:
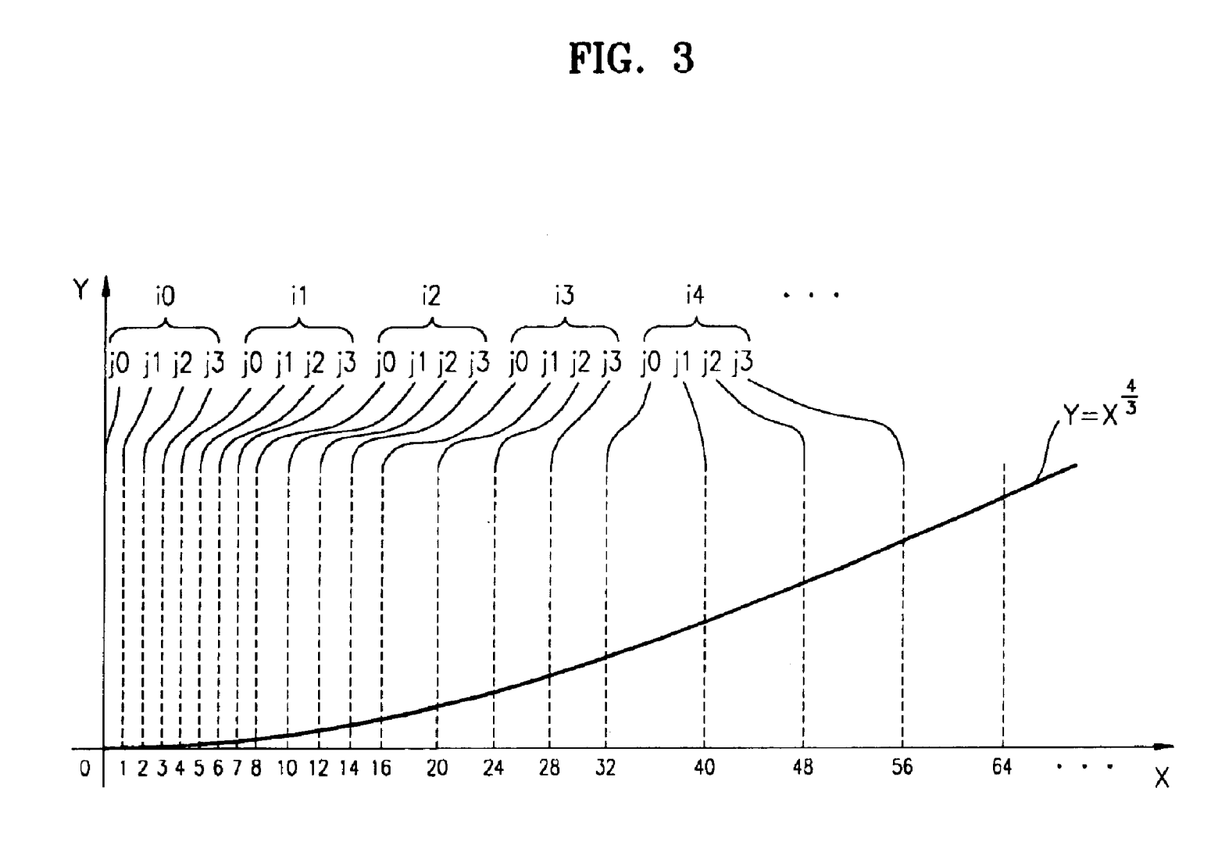
FIG. 3 is a graph for explaining an improved method of compressing a lookup table for reducing memory, according to one embodiment of the present invention.

FIG. 3 is a graph for explaining an improved method of compressing a lookup table for reducing memory, according to one embodiment of the present invention. FIG. 4 illustrates the main data and lookup table corresponding to the graph of FIG. 3. FIG. 5 is a flowchart illustrating the improved method of compressing a lookup table for reducing memory, according to one embodiment of the present invention.

Referring to the graph of FIG. 3 the x-coordinate of a non-linear function $Y=X^{4/3}$ is separated into a plurality of sections i0 through i4. In addition, each of the sections i0 through i4 includes four steps j0 through j3 having predetermined step sizes.

In the sections i0 and i1 where the gradient of the non-linear function $Y=X^{4/3}$ is steep, which are referred to as curve sections, the step size between the steps j0 through j3 is one. In the sections i2, i3, and i4 where the changes in the gradient of the non-linear function $Y=X^{4/3}$ are relatively and progressively reduced, which are referred to as "straight line' sections, the step size between the steps j0 through j3 is increased. More specifically, the step size between in the section i2 is two, and the step size in the section i3 is four. In addition, the step size in the section i4 is eight.

As a result, the step sizes increase by the exponentiation of 2 in the sections where the changes in the gradient of the non-linear function $Y=X^{4/3}$ are decreased. However, the step size in the curve sections where the gradient of the non-linear function $Y=X^{4/3}$ is steep is uniform in order to prevent errors due to the rapid change in the gradient.

Figure 4:
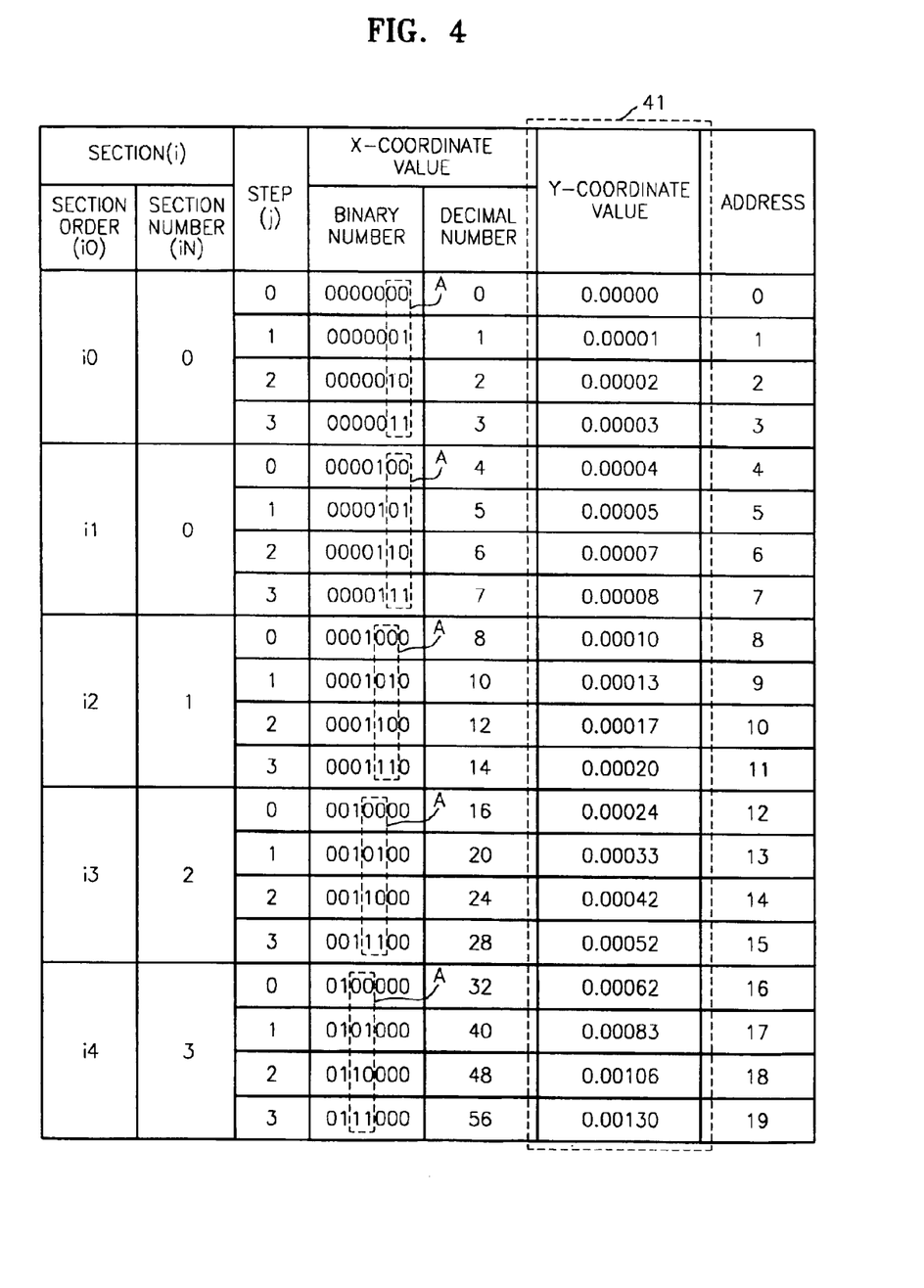
FIG. 4 illustrates main data and the lookup table of the graph of FIG. 3.
Figure 5:
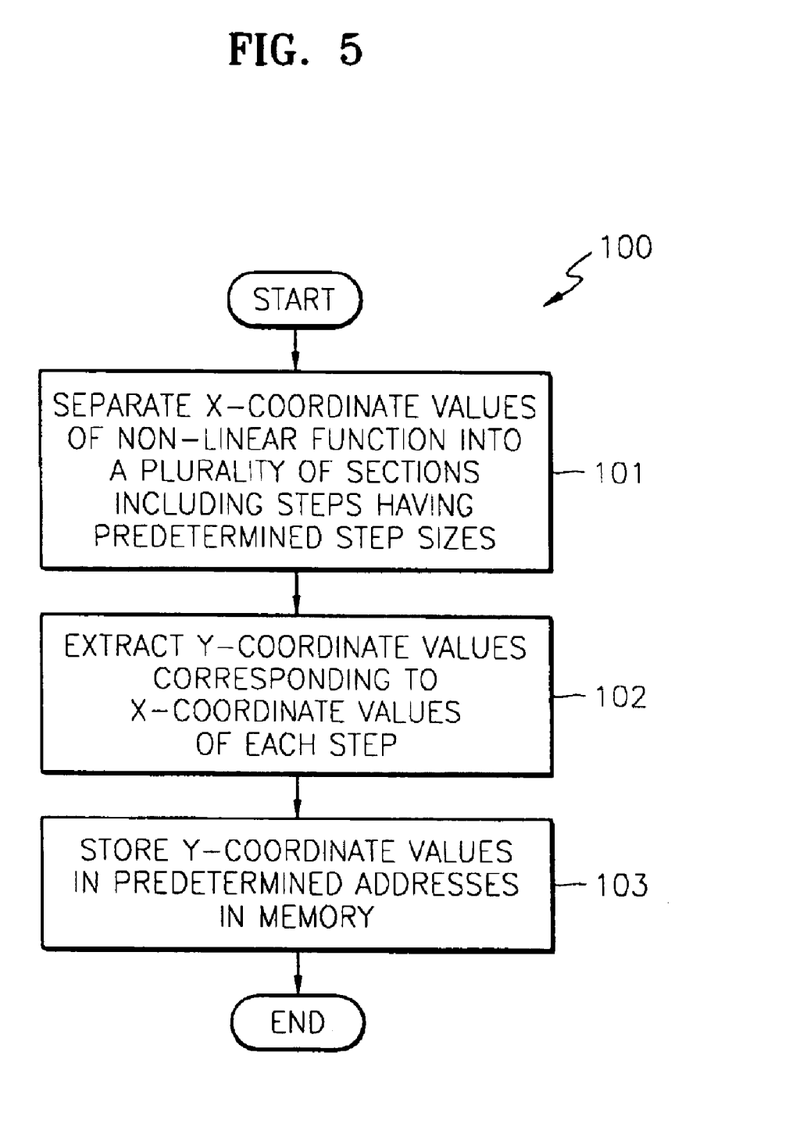
FIG. 5 is a flowchart illustrating an improved method of compressing a lookup table for reducing memory, according to one embodiment of the present invention.

The X-coordinate values, the Y-coordinate values, the sections, and the steps of the non-linear function $Y=X^{4/3}$ of FIG. 3 are illustrated as a table in FIG. 4.

Referring to FIG. 4, the X-coordinate values are separated into a plurality of sections i, and each of the sections i includes a plurality of steps j0, j1, j2, and j3. Here, different section orders $i_O$ and section numbers $i_N$ are assigned to each of the sections i.

The section orders $i_O$ increase as i0, i1, i2, i3, i4, . . . The section number $i_N$ of the first and second sections i0 and i1 are 0, and the section number $i_N$ increases as 1, 2, 3, . . . from the third section i2.

In addition, referring to the column where the X-coordinate values are illustrated by binary number, the X-coordinate values of the plurality of sections i0 through i4 have variable bits A, such as 00, 01, 10, and 11, for each step.

The X-coordinate values of the sections i1 through i4 other than the first section i0 further include upper bit 1 of the variable bits A for each step.

The Y-coordinate values corresponding to the X-coordinate values are stored in a memory 40 (refer to FIG. 6), as a lookup table 41 as shown in FIG. 4.

In FIGS. 3 and 4, each section includes four steps and the step sizes of the sections are increased by the exponentiation of 2; however, the number of steps can be varied. In addition, the precision of the non-linear function can be varied according to the number of steps included in each section. The relationship between the number of steps included in one section and the size of the lookup table is shown in Table 1.

TABLE 1

| Number of steps in section | Number of sections | Size of lookup table (item) |
|---|---|---|
| 1 | 14 | 14 |
| 2 | 13 | 26 |
| 3 | 12 | 48 |
| 4 | 11 | 88 |
| 16 | 10 | 160 |
| 32 | 9 | 288 |
| 64 | 8 | 512 |

The size of the lookup table in Table 1 is refers to the case where the Y-coordinate values corresponding to the X-coordinate values of 0 through 8191 in the non-linear function $Y=X^{4/3}$ are to be represented. The number of sections is determined according to the number of steps in each section. Here, the number of steps is in inverse proportion to the number of sections. As the number of steps in each section increases, the size of the lookup table increases while reducing errors.

As shown in Table 1, when the method of compressing the lookup table according to one embodiment of the present invention is performed, the size of the lookup table is remarkably reduced, as compared to the case of an uncompressed lookup table that has 8192 items. In addition, since the non-linear function generating apparatus according to the present invention does not need a separate gradient table, the memory occupied by the lookup table can be reduced.

The X-coordinate values are represented by 7-bit binary numbers in FIG. 4; however, the number of bits of the binary numbers for the X-coordinate values can be varied according to the range of the X-coordinate values. For example, when the X-coordinate values range from 0 to 8191, the X-coordinate values can be represented by 13-bit binary numbers.

Hereafter, a process of compressing the lookup table for reducing the memory, according to one embodiment of the present invention will be described with reference to the flowchart of FIG. 5.

The X-coordinate values of the non-linear function are separated into a plurality of sections i0, i1, i2, i3, i4, . . . including steps j0, j1, j2, and j3 that have predetermined step sizes, as shown in FIG. 3, in step 101. The Y-coordinate values corresponding to each of the steps of the X-coordinate values are extracted in step 102. Thereafter, the Y-coordinate values are stored in a predetermined address of the memory to form the lookup table in step 103.

Figure 6:
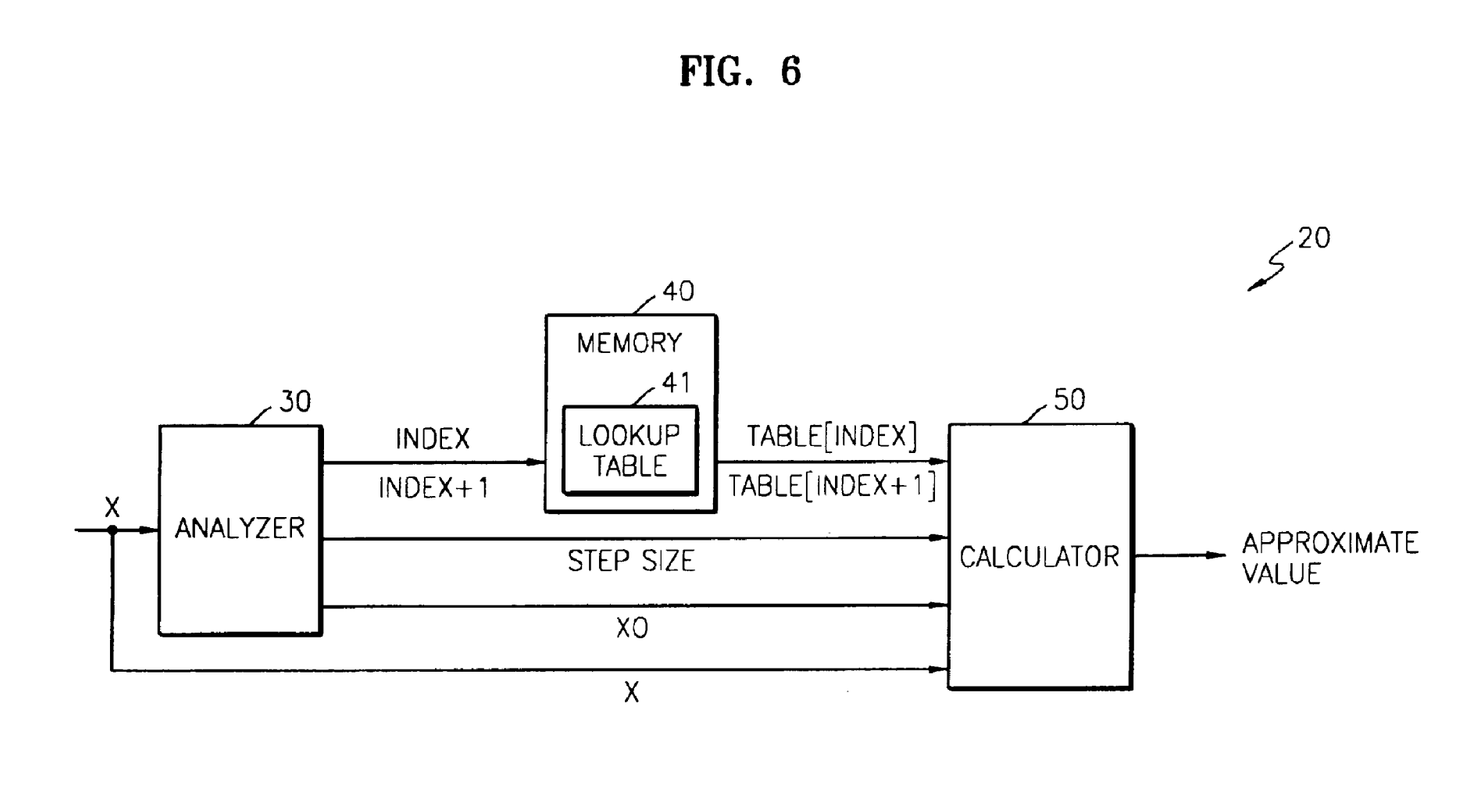
FIG. 6 is a block diagram illustrating a non-linear function generating apparatus having a lookup table compressed using a method of compressing a lookup table for reducing memory according to one embodiment of the present invention.

FIG. 6 is a block diagram illustrating the non-linear function generating apparatus having the lookup table compressed using the method of compressing the lookup table for reducing the memory, according to one embodiment of the present invention.

Referring to FIG. 6, the non-linear function generating apparatus 20 includes an analyzer 30, a memory 40, and a calculator 50.

The analyzer 30 calculates analysis information including the address from the input X-coordinate value and outputs the calculation result. Here, the analysis information includes the section information and the step information on the section and the step in which the input X-coordinate value is included, the step size, and the approximate X-coordinate value of the input X-coordinate value.

The approximate X-coordinate value denotes a maximum value from the X-coordinate values corresponding to the items in the lookup table while being smaller than the input X-coordinate value. The approximate X-coordinate value will be referred to as X0, hereafter.

In addition, the section information denotes the section number $i_N$, and the address is calculated from the section information and the step information.

The memory 40 including the lookup table 41 (refer to FIG. 4) outputs the Y-coordinate values corresponding to the address. In the lookup table, a plurality of Y-coordinate values, which are extracted according to predetermined step sizes, are stored in the predetermined address.

The calculator 50 calculates the approximate Y-coordinate value corresponding to the input X-coordinate value using the analysis information and the Y-coordinate values and outputs the calculation value.

The operation of the non-linear function generating apparatus will now be described with reference to FIG. 7.

Figure 7:
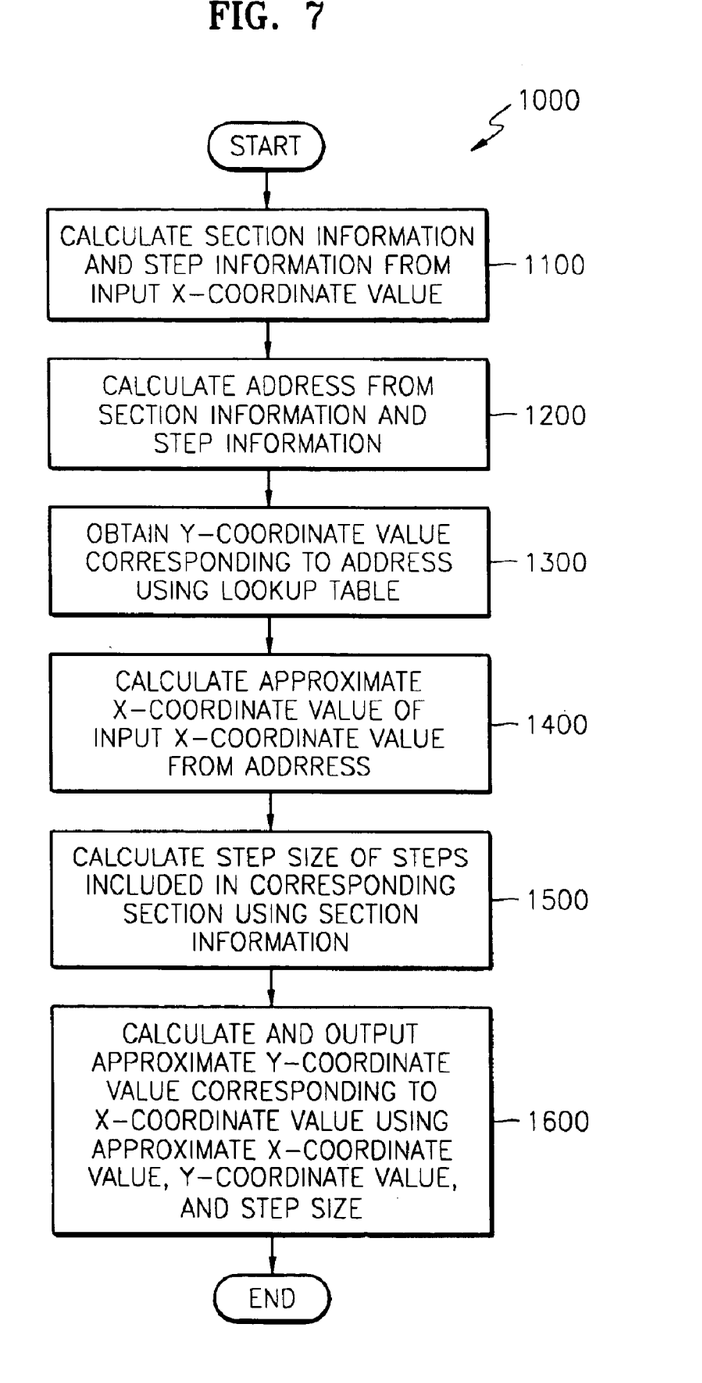
FIG. 7 is a flowchart illustrating a process of generating a non-linear function in the non-linear function generating apparatus of FIG. 6.

FIG. 7 is a flowchart illustrating a process of generating the non-linear function in the non-linear function generating apparatus of FIG. 6.

The analyzer 30 calculates the section information and the step information from the input X-coordinate value in step 1100. The analyzer 30 calculates the address from the section information and the step information and outputs it to the memory 40, in step 1200.

Here, the section information denotes the section number $i_N$, and the step information denotes 3-bit data including the lower two bits as the step variable bits A and the upper one bit located in front of the lower two bits. Referring to FIG. 4, the step information on the third step j2 of the second section i1 is 110. Step 1100 will be described below with reference to FIG. 9.

The address can be obtained by shifting the section number $i_N$ twice in a left direction and adding the step information. The value obtained by shifting the section number $i_N$ twice in the left direction is the same as the value obtained by multiplying the section number $i_N$ by four. A multiplier is not used in the present invention because the multiplier occupies a large area in a semiconductor device and the multiplier can be substituted by a binary shifting operation.

In addition, the section number $i_N$ is multiplied by four because one section includes four steps.

More specifically, when the section number $i_N$ is 2, which is 10 as the binary number, and the step information j is 101, the address is calculated as follows.

The section number $i_N$ of 10 is shifted twice in the left direction so that the section number $i_N$ becomes 1000. Thereafter, the step information j 101 is added to the shifted section number $i_N$. Accordingly, the address 13, which is 1101 as the binary number, is obtained.

Thereafter, the Y-coordinate value corresponding to the address is output from the lookup table 41 of the memory 40, in step 1300. Here, two Y-coordinate values of table[index] and table[index+1] are output from the memory (refer to FIG. 6). The Y-coordinate values are required to calculate the approximate value while corresponding to the addresses of index and index+1 for the steps in which the X-coordinate values are included.

The analyzer 30 calculates the X0 value (refer to FIG. 6) of the X-coordinate value from the addresses, in step 1400. Step 1400 will be described below with reference to FIG. 10.

The analyzer 30 calculates the step size of the steps included in the corresponding section using the section information, which is calculated in step 100, in step 1500.

The process of calculating the step size of the steps in step 1500 represented in C-language is shown in Table 2.

TABLE 2

```
int x2step(int X){
    int i;
    int j = x;
    for(i=0;j>=8;i++)
        j >>= 1;          /*obtain section number iN*/
    return 1 << i;        /*2IN becomes step size of steps*/
}
```

Here, i denotes the section number $i_N$ and j denotes the location of the step in the section.

The step size is calculated as the value of $2^{iN}$. Accordingly, when the section number $i_N$ is 0, the step size of the steps becomes $2^0=1$. When the section number $i_N$ is 2, the step size of the steps becomes $2^2=4$.

The calculator 50 calculates the approximate Y-coordinate value corresponding to the X-coordinate value using the X0 value of the X-coordinate value, the Y-coordinate value, and the step size of the steps and outputs the calculation result, in step 1600.

Here, the approximate value is calculated using a linear function Y=aX+b (refer to FIG. 8), wherein a denotes the gradient and b denotes the Y-coordinate value corresponding to the X0 value.

approximate value Y=table[index]+(table[index+1]−table[index])*(X−X0)/STEP SIZE

Here, table[index] corresponds to b of the linear function, (table[index+1]−table[index])/STEP SIZE corresponds to a of the linear function, and (X−X0) corresponds to the variables of X-coordinate value. STEP SIZE denotes the coordinate interval between the steps, and X0 value is calculated by converting X into an index value using an index function and converting the index value into the X-coordinate value. When X is converted from the index value to the X-coordinate value, the X0 value corresponding to the approximate index value of X is obtained. Here, the index function is included in the analyzer 30 (refer to FIG. 6).

Figure 8:
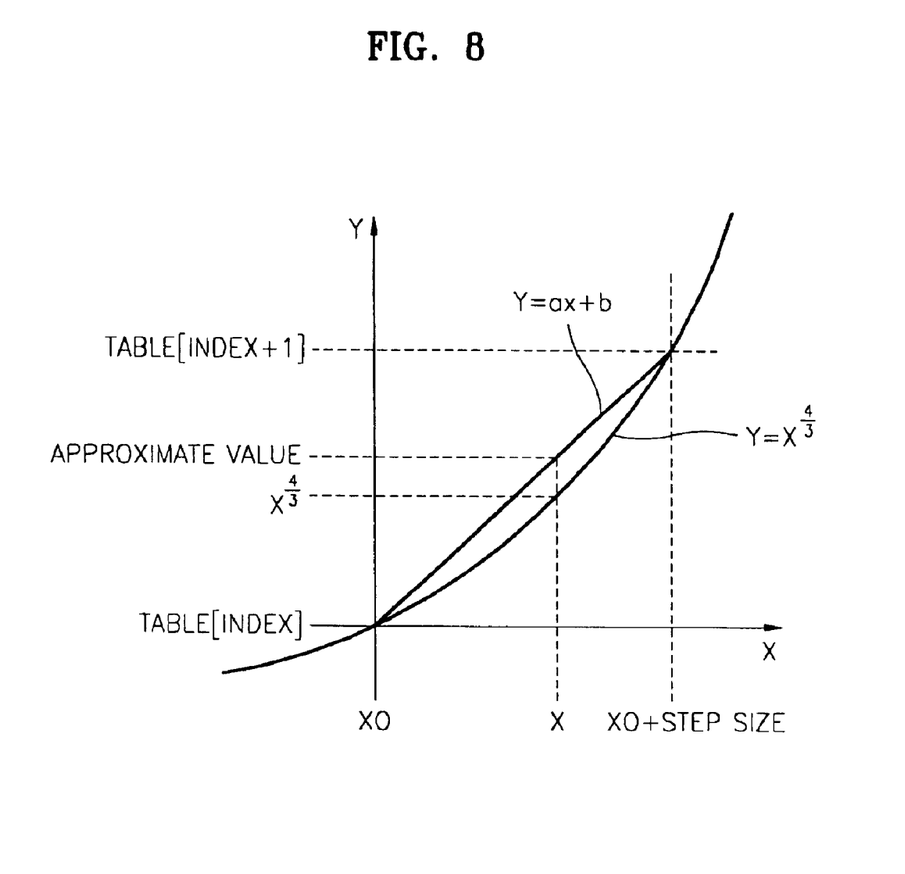
FIG. 8 is a graph that illustrates the relationship between X-coordinate values and Y-coordinate values used for calculating approximate values in the non-linear function generating apparatus of FIG. 6.

FIG. 8 is a graph illustrating the relationship between the X-coordinate values and the Y-coordinate values used in calculating the approximate values using the non-linear function generating apparatus of FIG. 6.

Referring to the graph of FIG. 8, the approximate value of the non-linear function $Y=X^{4/3}$ is calculated from the linear function Y=aX+b. The values table[index] and table[index+1] are Y-coordinate values output from the lookup table using the addresses, which are output from the analyzer 30.

The X0 value is calculated by converting the X into an index value using the index function and converting the index value into the X-coordinate value.

Figure 9:
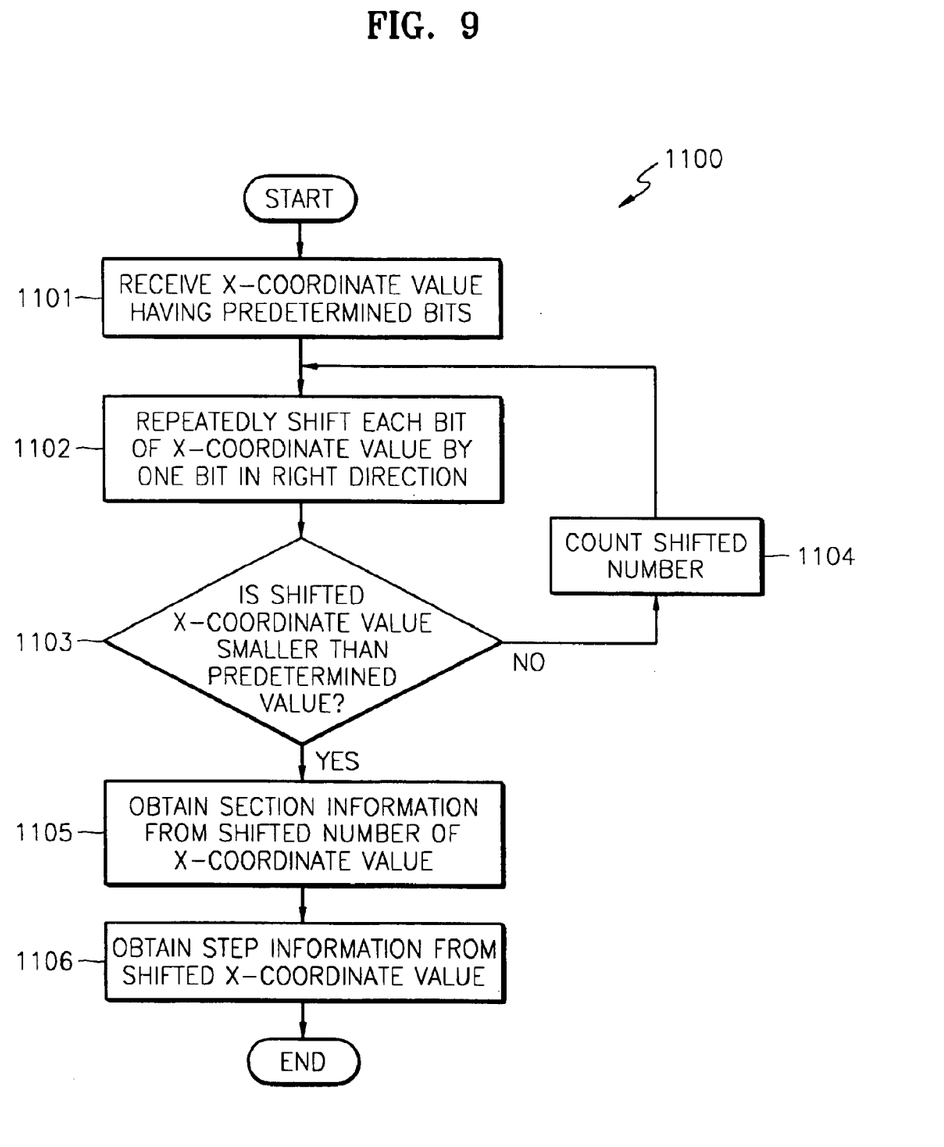
FIG. 9 is a flowchart illustrating a process of calculating section information and step information in the flowchart of FIG. 7.

FIG. 9 is a flowchart illustrating a process of calculating the section information and the step information in the flowchart of FIG. 7.

Referring to FIG. 9, the X-coordinate value having a predetermined number of bits is received in step 1101. Each bit of the X-coordinate value is shifted in a right direction until the X-coordinate value becomes less than a predetermined value, in steps 1102 and 1103. Here, the predetermined value is determined by multiplying the number of steps in one section by two. The number of steps in one section is four in FIG. 9. Accordingly, the predetermined value is 8, which is 1000 as the binary number.

The shifted number of the X-coordinate value is counted in step 1104. Thereafter, when the X-coordinate value is less than 8, which is 1000 as a binary number, the section information is obtained from the counted number, in step 1105. Here, the section information denotes the section number $i_N$.

Thereafter, the step information is obtained from the shifted X-coordinate value in step 1106. Here, the step information is a three-bit data including the lower two bits as the variable bits A for each step and upper one bit located in front of the lower two bits.

The process of calculating the section information and the step information represented in, C-language is shown in Table 3.

TABLE 3

```
int x2index(int x) {
    int i;
    int j = x;
    for(i=0;j>=8;i++)
        j>>=1;            /*shift once in right direction results in same
                            effect as dividing by 2*/
    return(i<<2) + j;     /*shift twice in left direction results in same
                            effect as multiplying by 4*/
}
```

Here, i denotes the section number $i_N$ and j denotes the location of a step in the section. The return value denotes the address.

An example of the process of calculating the section information and the step information will now be described.

When the X-coordinate value of 42, which is 0101010 as the binary number, is input, the X-coordinate value is repeatedly shifted by one bit in a right direction in the case where the X-coordinate value is over 8, which is 1000 as the binary number. The shifting process of the X-coordinate value of 42 is shown in Table 4.

TABLE 4

| | |
|---|---|
| 0101010 | i = 0 |
| 0010101 | i = 1 |
| 0001010 | i = 2 |
| 0000101 | i = 3 |

Since the shifting process is repeated three times, the section number $i_N$ is 3. In addition, since the shifting result is 101, it is known that the step is the second step by comparing the lower two bits 01 of the shifting result with the variable bits A. Accordingly, the section information and the step information of the X-coordinate value is the second step j1 of the i4 section with reference to the table of FIG. 4.

In addition, in order to calculate the address using the section information and the step information, the section information is shifted twice in the left direction and the step information is added to the shifted result.

When the section information 3, which is 0011 as the binary number, is shifted twice in the left direction, the value 1100 is obtained. When the step information 101 is added to the shifted result 1100, the address becomes 17, which is 10001 as the binary number.

Figure 10:
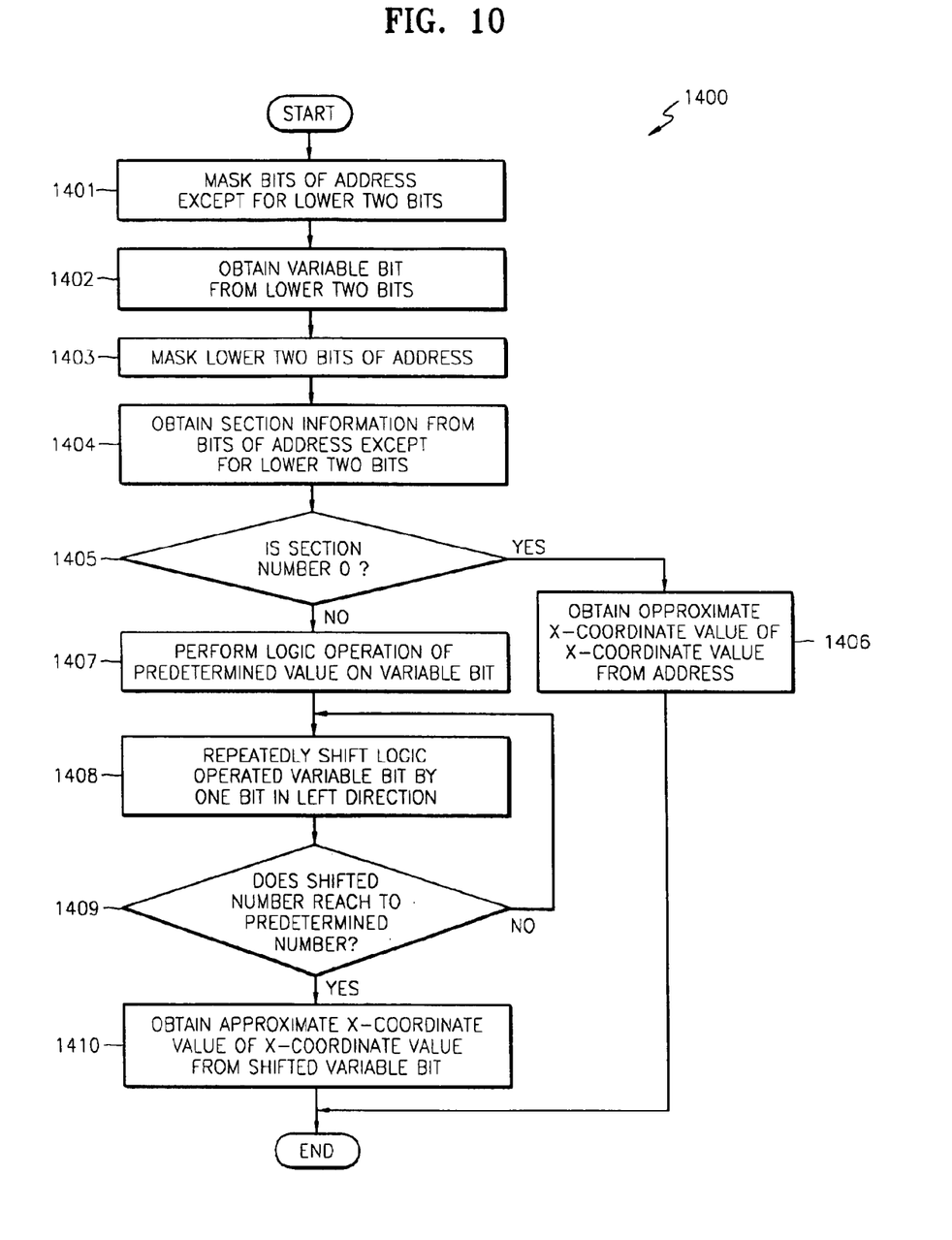
FIG. 10 is a flowchart illustrating a process of calculating X-coordinate values approximating X-coordinate from a lookup table in the flowchart of FIG. 7.

FIG. 10 is flowchart illustrating a process of calculating the X0 value from the flowchart of FIG. 7.

The bits of the address except for lower two bits are masked in step 1401. Here, the bits can be masked by performing AND operation of 3, which is 0000011 as the binary number, on the address.

The variable bits A are obtained from the lower two bits of the address, which are not masked, in step 1402. Thereafter, the lower two bits of the address are masked in step 1403. Here, the lower two bits can be masked by performing AND operation of 1111100, which is obtained by inverting the value 3 that is 0000011 as the binary number, on the address.

The section information is obtained from the unmasked bits of the address other than the lower two bits, in step 1404. Here, the section information denotes the section order $i_O$.

Thereafter, it is determined whether the section number $i_N$ of the section is 0 in step 1405. When the section number $i_N$ is 0, the X0 value is obtained from the address in step 1406. For example, when the address is 5, which is 101 as the binary number, the X0 value is 5, which is 101 as the binary number, according to the address.

When the section number $i_N$ is other than 0, a predetermined value is logically applied to the step information, in step 1407. In addition, the logic operated step information is repeatedly shifted by one bit in the left direction until the shifted number becomes a predetermined number, in steps 1408 and 1409. Here, the predetermined value is 4, which is 100 as the binary number, and the shifted number is the section number $i_O-1$. In addition, the logic operation can be an OR operation.

Thereafter, when the shifting operation is complete, the X0 value is obtained from the shifted variable bits A, in step 1410.

For example, when the variable bits A are 01 and the section order $i_O$ is 2, the OR operation of 4, which is 100 as the binary, number, is performed on the variable bits 01 to obtain a value 101. When the value 101 is shifted once in the left direction, a value 1010 is obtained. Accordingly, the X0 value is 1010.

The process of calculating the X0 value from the address represented in C-language is shown in Table 5.

TABLE 5

```
int index2x(int index){
    int x = index & 0 X 3;   /*lower two bits of address*/
    int i = index & ~0 X3;   /*upper bits of address except for lower
    if (i) {                  two bits*/
        x |= 0 X 4;
        x <<= i - 1;
    }
    return x;
}
```

An example of the process of calculating the X0 value will now be described.

In the case where the address is 13, which is 1101 as a binary number, when the upper bits except for the lower two bits are masked, the variable bits 01 are left. In addition, when the lower two bits of the address 1101 are masked, the upper bits 11 are left.

Since the upper two bits are 3, which is 11 as the binary number, the section order $i_O$ is 3. Here, the section number $i_N$ of the section i3 is not 0, so an OR operation of 4, which is 100 as the binary number, is performed on the variable bits 01 to obtain a value 101.

The value 101 is shifted twice, which is the section order $i_O-1$, in the left direction to obtain a value 10100. Accordingly, the X0 value becomes 10100.

As described above, the method of compressing the lookup table, the non-linear function generating apparatus having the lookup table compressed using the method, and the non-linear function generating method, according to the present invention can reduce the capacity of the memory occupied by the lookup table.

In addition, the non-linear function generating apparatus calculates the data, which are required to calculate the approximate values, by performing shifting operations without using a multiplier so that the size of a digital signal processing semiconductor device is reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of compressing a lookup table of an apparatus for generating a non-linear function in which a change in gradient is progressively reduced, the method comprising:

separating X-coordinates of the non-linear function into a plurality of sections including steps that have predetermined step sizes;

extracting Y-coordinate values corresponding to X-coordinate values for each step; and storing the Y-coordinate values in predetermined addresses in a memory, wherein the step sizes are different according to the sections.

2. The method of claim 1, wherein some sections of the plurality of sections include steps having the same step size, and the other sections of the plurality of sections include steps having different step sizes.

3. The method of claim 2, wherein in the other sections, as the change in the gradient of the non-linear function is reduced, the step sizes are increased.

4. The method of claim 3, wherein the step sizes are increased by an exponent of 2.

5. The method of claim 1, wherein each of the plurality of sections includes at least one step.

6. The method of claim 5, wherein the number of steps of each section is an exponent of 2.

7. The method of claim 5, wherein the X-coordinate values of the steps included in each of the plurality of sections are represented by binary numbers, and variable bits that include more than one bit of the binary number of the step are used to calculate step information corresponding to the X-coordinate value within the section including the X-coordinate value.

8. An apparatus for generating a non-linear function in which a change in gradient is progressively reduced, the apparatus comprising:

an analyzer calculating and outputting analysis information including addresses based on an input X-coordinate value;

a memory including a lookup table in which Y-coordinate values corresponding to the X-coordinate values for each step of the non-linear function, the y-coordinate values being separated into a plurality of sections including the steps having predetermined step sizes and being stored in predetermined addresses, the memory outputting the Y-coordinate values corresponding to the addresses; and a calculator calculating and outputting an approximate Y-coordinate value corresponding to the input X-coordinate value using analysis information and the Y-coordinate values corresponding to the addresses, wherein the step sizes are different according to the sections, the analysis information includes section information and step information of the section where the input X-coordinate value is included, the step sizes, and an approximate X-coordinate value of the input X-coordinate value, and the addresses include the address of the step in which the input X-coordinate value is included and the address of the subsequent step.

9. A non-linear function generating method using an apparatus for generating a non-linear function in which a change in gradient is progressively reduced, wherein the apparatus includes a lookup table in which Y-coordinate values corresponding to X-coordinate values of each step of the non-linear function separated into a plurality of sections including steps with predetermined step sizes are stored in predetermined addresses, the method comprising:

calculating section information and step information using an input X-coordinate value;

calculating an address using the section information and the step information;

obtaining a Y-coordinate value corresponding to the address using the lookup table;

calculating an approximate X-coordinate value of the input X-coordinate value using the address;

calculating step size of the corresponding section using the section information; and calculating and outputting an approximate Y-coordinate value of the Y-coordinate value corresponding to the input X-coordinate value using the approximate X-coordinate value of the X-coordinate, the Y-coordinate value corresponding to the address, and the step size.

10. The method of claim 9, wherein the X-coordinate values of the steps included in the plurality of sections are represented by binary numbers, and variable bits including more than one bit of the binary number of the steps are used to calculate the step information corresponding to the X-coordinate value in the section including the X-coordinate value.

11. The method of claim 10, wherein calculating an approximate X-coordinate value of the input X-coordinate value using the address comprises:

obtaining the variable bits from a predetermined lower bit group of the binary number representing the address;

obtaining the section information from a predetermined upper bit group of the binary number representing the address; and obtaining an approximate X-coordinate value of the X-coordinate from the variable bits according to the section information.

12. The method of claim 11, wherein the section information includes section orders and section numbers.

13. The method of claim 12, wherein obtaining an approximate X-coordinate value of the X-coordinate from the variable bits according to the section information comprises:

when the section number is other than 0, a logic operation of a predetermined data is performed on the variable bits; and shifting the logic operated variable bits by a predetermined number in a left direction to obtained the X-coordinate value.

14. The method of claim 13, wherein the predetermined data is the number of steps in one section.

15. The method of claim 12, wherein if the section number is 0, the variable bits are the approximate X-coordinate value of the X-coordinate value, when obtaining an approximate X-coordinate value of the X-coordinate from the variable bits according to the section information.

16. The method of claim 9, wherein calculating section information and step information using an input X-coordinate value comprises:

receiving the X-coordinate value having predetermined binary bits;

repeatedly shifting each bit of the X-coordinate value by one bit in a right direction until the shifted X-coordinate value becomes less than a predetermined value and obtaining a final shifted value;

obtaining the section information based on the number of shifts of the X-coordinate value; and obtaining the step information from the final shifted value.

17. The method of claim 16, wherein the section information includes section numbers, and the step information is the location of the step in the section.

18. The method of claim 17, wherein calculating an address using the section information and the step information comprises:

repeatedly shifting the binary bits representing the section information by one bit in a left direction for a predetermined number of times; and adding the step information to the shifted section information to calculate the address.

19. The method of claim 18, wherein the shifted number is determined by t as a natural number when the number of steps is $2^t$.

20. The method of claim 16, wherein the predetermined value is twice as much as the number of steps included in one section.

* * * * *